(12) United States Patent
Koenig et al.

(10) Patent No.: US 11,703,542 B2
(45) Date of Patent: Jul. 18, 2023

(54) EMBEDDED TEST APPARATUS FOR HIGH SPEED INTERFACES

(71) Applicant: Infineon Technologies AG, Neubiberg (DE)

(72) Inventors: Dietmar Koenig, Munich (DE); Hosea Busse, Jena (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/681,970

(22) Filed: Feb. 28, 2022

(65) Prior Publication Data

US 2022/0276305 A1 Sep. 1, 2022

(30) Foreign Application Priority Data

Mar. 1, 2021 (DE) ..................... 10 2021 001 093.0

(51) Int. Cl.
*G01R 31/317* (2006.01)
*G01R 31/3187* (2006.01)

(52) U.S. Cl.
CPC ... *G01R 31/31721* (2013.01); *G01R 31/3187* (2013.01)

(58) Field of Classification Search
None
See application file for complete search history.

(56) References Cited

U.S. PATENT DOCUMENTS

| 5,903,605 | A  | * | 5/1999  | Crittenden | ........ H04L 25/03019 |
|           |    |   |         |            | 370/518                |
| 7,805,115 | B1 | * | 9/2010  | McMorrow   | ........... H03F 1/0222 |
|           |    |   |         |            | 455/108                |
| 9,046,910 | B2 | * | 6/2015  | Sako       | ........................ H03L 1/022 |
| 10,505,645| B2 | * | 12/2019 | Fujita     | ............... G01R 19/16538 |
| 2003/0081699 | A1 | * | 5/2003 | Takatori | ................ H04L 7/0062 |
|           |    |   |         |            | 375/376                |

(Continued)

FOREIGN PATENT DOCUMENTS

| EP | 2148461 A2   | 1/2010 |
| TW | 201009369 A  | 3/2010 |

OTHER PUBLICATIONS

Z. Marais, et al., "Reduction of Static Electricity Meter Errors by Broadband Compensation of Voltage and Current Channel Differences," in IEEE Transactions on Instrumentation and Measurement, vol. 70, pp. 1-11, 2021, Art No. 1501511, doi: 10.1109/TIM.2020.3039631. (Year: 2020).*

*Primary Examiner* — Daniel F. McMahon
(74) *Attorney, Agent, or Firm* — Eschweiler & Potashnik, LLC

(57) ABSTRACT

An integrated circuit is provided that comprise a receive unit to be tested for receiving an input signal and storing the input signal at a predetermined point of time. Additionally, it comprises a processor for applying an error correction to the received input signal, for comparing the error corrected signal with an expectation value and for outputting an error message when the filtered input signal does not correspond to the expectation value. A power source supplies the receive unit to be tested with an adjustable voltage and/or and adjustable current. An adjustment unit varies the predetermined point in time and the adjustable voltage respectively the adjustable current.

20 Claims, 2 Drawing Sheets

(56) References Cited

U.S. PATENT DOCUMENTS

| | | | |
|---|---|---|---|
| 2006/0200511 A1* | 9/2006 | Park | H04L 25/03019 |
| | | | 708/232 |
| 2007/0063723 A1* | 3/2007 | Dworski | H03M 1/1095 |
| | | | 324/762.02 |
| 2010/0007366 A1 | 1/2010 | Watanabe et al. | |
| 2010/0226421 A1* | 9/2010 | Kibune | H03M 1/182 |
| | | | 375/229 |
| 2015/0155057 A1* | 6/2015 | Jeong | G06F 11/1004 |
| | | | 714/719 |
| 2021/0293883 A1* | 9/2021 | Onuma | H04L 1/0061 |

* cited by examiner

EMBEDDED TEST APPARATUS FOR HIGH SPEED INTERFACES

REFERENCE TO RELATED APPLICATION

This application claims priority to German Application number 10 2021 001 093.0, filed on Mar. 1, 2021, the contents of which are hereby incorporated by reference in their entirety.

BACKGROUND

A routine test for high speed products that have just been produced is difficult or may only be possible with a costly remodeling of the routine production site, which is expensive due to the supplement with new test components.

The quality of a receiver apparatus of an integrated circuit may be tested by a so called Shmoo test.

In doing so, a test pattern is applied several times, whereby at least one of two test parameters is changed between each test run, such that the test pattern will subsequently be applied with all combinations of parameter values. After the application of the respective combination, it will be stored if the test resulted is the expected, correct result. Then, the results of the test are shown by marking the parameter combination having the result "error free" with a first color in a two dimensional coordinate system, and by marking the parameter combination having the result "with error" with a second color. It is graphically shown in easily understandable manner at which combinations the integrated circuit to be tested works and at which combination it does not.

When producing the parameter combinations, the external parameters, typically voltage and a time delay called phase, are varied with the help of an external tester. Typical variations of external components and wirings may be represented with these two parameters. If, for example, there is an electrical connection with a relatively high resistance between a power supply and the integrated circuit, the voltage at the integrated circuit is lower than the voltage generated by the power supply.

By reducing the voltage in a test run, it is tested if the integrated chip will still be functional under the condition that the connection between the voltage source and the integrated chip has a relatively high resistance. By varying the phase, the effects of propagation times being different between clock lines and signals lines may be emulated. If the requirements on the precision of these tests increase, the external testers become more complex.

SUMMARY

It is a goal of this disclosure to provide a test for high-speed interfaces that can work without the help of additional components.

In an embodiment, an integrated circuit is provided that comprises a receiver unit to be tested for receiving an input signal and for storing the input signal at a predetermined point in time and a filter for filtering the stored input signal. Further, the integrated circuit comprises a processor, typically a micro-controller or a microprocessor, which is constructed to apply an error correction, to compare the error-corrected signal with an expectation value and to output an error message if the filtered input signal does not correspond to the expectation value. A processor is understood here and in the following as a programmable computing unit that executes calculation steps according to provided commands.

A power supply of the integrated circuit serves as supply for the receive unit under test with an adjustable voltage and/or an adjustable current and a control unit provides variations of the predetermined point in time and the adjustable voltage respectively the adjustable current. A power supply is understood as a circuit that provides electrical power and is e.g. implemented as a voltage converter.

Before the filtered signal is compared, the processor of the proposed integrated circuit applies an error correction to this signal. It may be prevented that the integrated circuit is over-critically tested. Assuming the case that, under certain parameter conditions, an input signal is received and stored such that the receive unit does not emit its desired output signal. However, this does not lead to an error of the integrated circuit because, under these parameter conditions, a possible failure is prevented by at least one element in the processor or in the path between the receive unit and the processor.

In modern micro controllers, there is a plurality of error correction mechanisms that may correct errors, especially single errors. In a normal mode of the integrated circuit, the error would be eliminated. The elimination also occurs in the test, such that no error is reported in the test result. It is justified that no error is reported, because no failure would happen in normal mode. If the receive unit were separately tested, the test result would show an error, even if it not critical for the normal mode.

DRAWINGS

In the following, embodiments will be described with reference to the figures.

DETAILED DESCRIPTION

The following detailed description will reference to the attached drawings, in which specific embodiments are shown for illustrative purposes. It should be understood that different embodiments may be used and structural changes may be made without departing from the scope of the disclosure. It should be understood that the features of different exemplary embodiments may be combined if not explicitly declared otherwise. The following detailed description should not be understood as limiting and the scope of protection is defined by the attached patent claims.

In the context of this description, the terms "connected" and "coupled" are used for describing both direct and indirect connections and both direct and indirect coupling.

Figure 1:
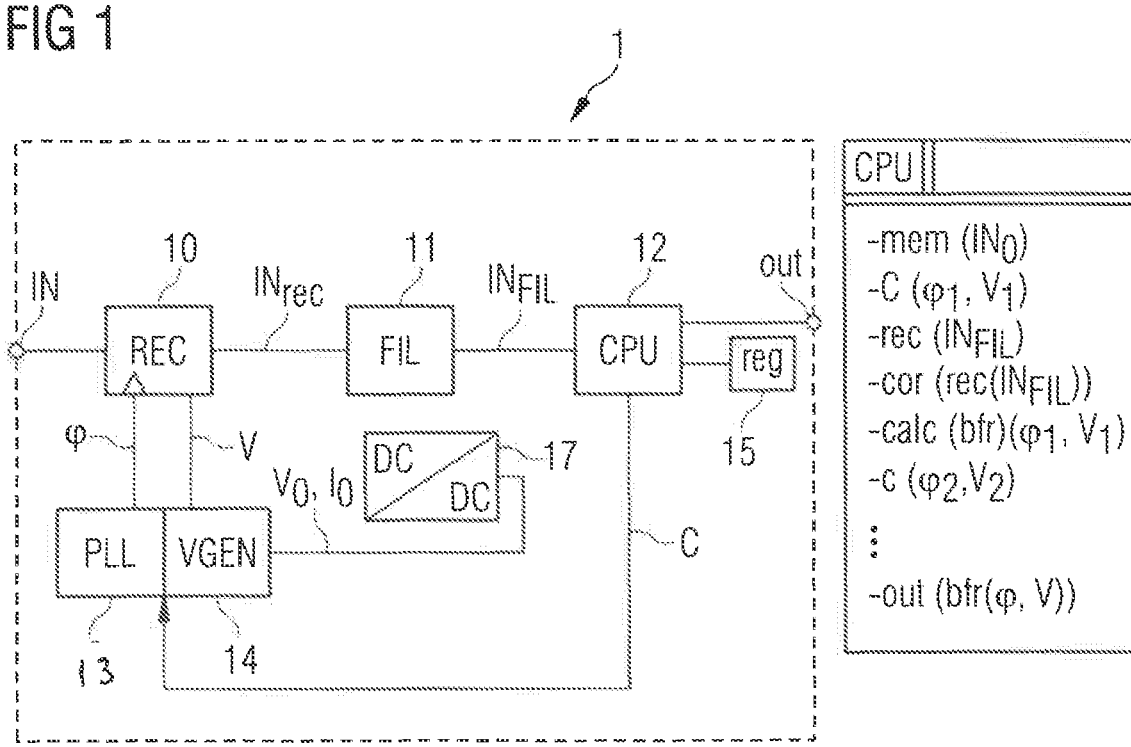
FIG. 1 shows an integrated circuit according to a first embodiment.

FIG. 1 schematically shows an integrated circuit 1 according to a first embodiment. The perimeter of the integrated circuit 1 is marked by a dashed line. At ports on this perimeter, electrical connections from the external area to internal elements of the integrated circuit 1 may be provided.

An input port of the integrated circuit 1 is named IN, an output port is named OUT. The input port IN is connected to a first input of the input receive unit 10, at the output OUT of the integrated circuit 1 emits the signal INrec. The receive unit 10 receives the signal φ at its clock input and a voltage V at its supply inputs. The voltage V received at the supply inputs is used for supplying the receive unit 10. The signal φ is used for defining in the receive unit 10 when the received input signal IN shall be stored. The signal φ is also called phase.

In embodiments, the receive unit 10 is implemented in several instances which each receives the same phase φ and the same voltage V, but a different input signal. Thus, there are several output signals INrec.

The signal INrec is output to the filter 11. This filter 11 may be a high pass filter, a low pass filter or a band pass filter, that filters out predetermined frequency bands.

The output signal INFIL of filter 11 may be changed compared to the input signal INrec. In case of a low pass filter, high-frequency noise elements in the signal INrec are filtered out. The signal INFIL is processed in the processor, in particular it is subject to an error correction, and is later checked if it complies to an expected result. The result of this check is stored in the memory 15. The information, at which parameter values voltage and phase the result was achieved is stored next to the result in the memory 15.

The processor 12 also controls the phase adjustment unit 13 and the voltage adjustment unit 14 according to the adjustment signal C. The adjustment signal C is provided on a communication path extending between the processor 12 and the receive unit 10, and the communication path includes the phase adjustment unit 13 and the voltage adjustment unit 14. The phase adjustment unit 13 adjusts the timing of the signal φ, whereas the voltage adjustment unit 14 controls the level of the voltage V. By this, the receive unit 10 operates under different conditions.

A program that is noted on the right side of FIG. 1 runs in the processor 12. A test program that runs in the processor 12 may be designed in the following way. First, an expectation value INO that shows the expected result, is stored. Then, the processor 12 sets the adjustment signal C such that a first combination of first phase φ1 and first voltage V1 is output. The adjustment signal C is output to the adjustment unit in form of the phase adjustment unit 13 and the voltage adjustment unit 14. In an embodiment, the phase adjustment unit 13 is an PLL (phase locked loop) and the voltage adjustment unit 14 a low-drop-out voltage controller.

The voltage adjustment unit 14 receives a supply voltage V0 from the voltage source 17, from which it generates the supply voltage V for the receive unit 10. The level of the voltage V is adjusted by the voltage adjustment unit 14 according to the targets given by the adjustment signal C.

In other embodiments, not a supply voltage is adapted but a supply current, especially if the receive unit 10 is supplied by a current source.

A signal is received at the input port IN, processed by the receive unit 10 and sampled at a point in time which is given by the Phase φ1. The stored signal is output as INrec. After filtering, the filtered signal INFIL undergoes an error-correction initiated by the processor such that the signal INFIL will be either changed or not changed by the correction.

The thereby resulting value $INFIL_{cor}$ is compared with an expectation value INO. If the value $INFIL_{cor}$ corresponds to the expectation value INO, the result is "error free". If it does not correspond, the result is "with errors". In this embodiment, there are just two possible values for the result. In another embodiment, the value $INFIL_{cor}$ and the expectation value are both multiple valued such that the result, besides the information if an error is present or not, further comprise the magnitude of difference between the value $INFIL_{cor}$ and the expectation value.

The values corresponding does not necessarily mean that in all embodiments the values are exactly equal. It may mean that their difference is within a predetermined range.

The result of the comparison is stored in the memory 15. After the first test run, a second run starts. Therefore, the adjustment signal C is changed such that the second combination of phase and voltage is output, in this case with the same phase φ1 as in the first run, but with a different voltage V2 than in the first run. This new parameter combination is output to the adjustment circuit. The phase adjustment unit 13 does not need to change anything compared to the first run, but the voltage adjustment unit 14 shall change its output voltage.

In an embodiment, the voltage adjustment unit comprises an adjustable resistive divider, that provides a reference voltage for the low-voltage dropout regulator. By changing the divider relation of the resistive divider, the reference voltage is changed, which changes the absolute value of the output voltage V.

Now, the input signal being present at the input port IN is received at the receive unit 10, then processed, stored and output. The output signal is led through the filter 11 and is applied to an error correction, and then compared with the expectation value.

The error correction may be performed in different ways. If the input signal IN e.g. consists, like described above, of several values, it may contain redundant data, which may allow error correction of single fails in a data word. This is a correction in the direction of input values received in parallel. In addition or alternatively, the error correction is performed along subsequently received data, because an error-free signal may correspond to a certain waveform along the dimension of time. Thus, the original signal may be generated with the help of error detection in the processor if there are deviations from a certain waveform.

After comparing the corrected results with the expectation value, the result of the comparison is stored in the memory 15. The method continues until all required parameter combinations are applied at the receive unit and are used for test.

At the end of the process, the results are present in the memory 15, whereby it is also stored in the memory 15, at which parameter combination the respective result was stored. The memory content of memory 15 may be read by a user from the integrated circuit 1 through the output port OUT, e.g. for graphically displaying it in a Shmoo diagram.

It is also possible that the processor 12 executes method steps in a subsequent program, that changes the features of the integrated circuit 1. E.g. the capacitors in the filter 11 may be increased or decreased with the help of trim options.

Figure 2:
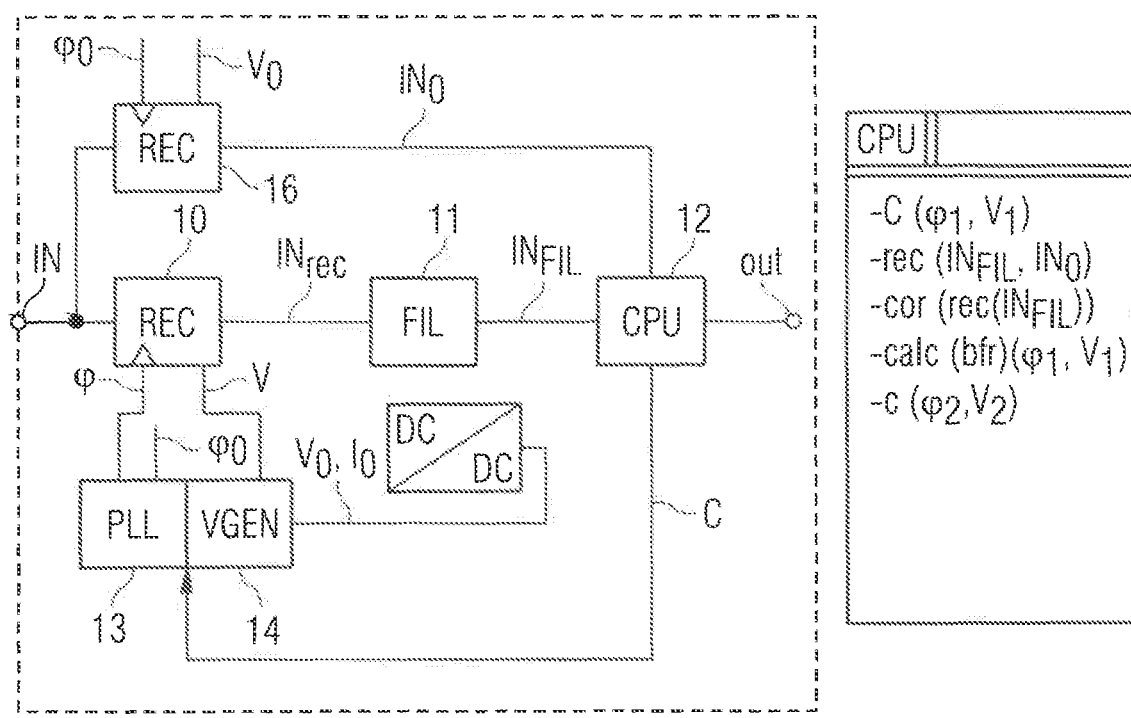
FIG. 2 shows an integrated circuit according to a second embodiment.

FIG. 2 shows a further embodiment of the proposed circuit 1. Elements with the same functions as in FIG. 1 are referenced with the same reference numbers. In difference to FIG. 1, the embodiment of FIG. 2 comprises a second receive unit 16 that is connected, as the first receive unit 10 known from FIG. 1, with the input port IN and gets an input signal from there. The clock signal φ0 is received by the second receive unit 16 as clock input. This clock signal φ0 is provided by the phase adjustment unit 13, but stays constant during the test in contrast to the clock signal φ and is not changed between test runs. Further, the first receive unit 10 receives the supply voltage V0 that also stays constant and does not change during the test.

The input signal present at the input port IN is received in parallel by the receive units 10 and 16, is processed, stored and output. The signal output by the receive unit 10 is led through the filter 11 and initially undergoes an error correction.

The signal INO output by the second receive unit 16 is received by the processor 12 and also undergoes an error correction. The error corrected signal is stored as expectation value that is compared with the error corrected signal being produced by INFIL. Thereby, a correlation of the error analysis to the received data may be achieved in embodiments. From this correlation, a solution may be derived by e.g. adapting the filter or dimensioning the external connections and components. A goal is to achieve a communication being error free or having an acceptable error level.

The test method proceeds as in the embodiment in FIG. 1. The difference is that no expectation value is read by the processor from a memory or from the outside. The expectation value is rather generated from the signal IN with the help of the second receive unit 16. With this method, it is checked if the change of phase and voltage in the receive unit leads to another result than undistorted received signals.

Figure 3:
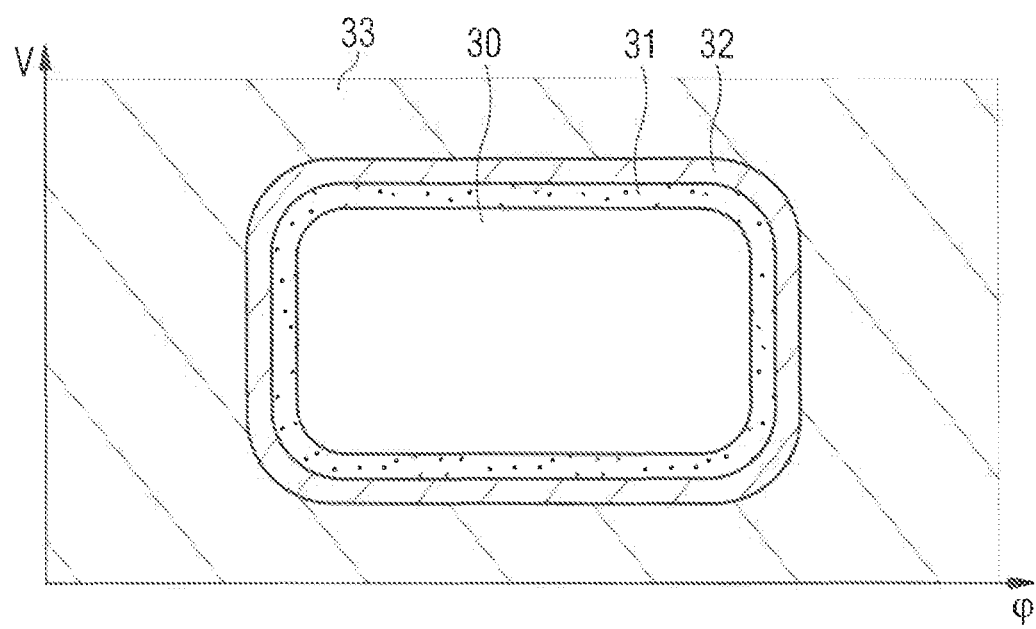
FIG. 3 shows an eye diagram as representation of a Shmoo test for an integrated circuit of FIG. 1 or FIG. 2.

FIG. 3 shows an eye diagram as result representation of a Shmoo test of an integrated circuit 1 according to FIG. 1 or FIG. 2. Therefore, the phase is drawn horizontally and the voltage vertically in the coordinate system. The so-called eye is in the middle, the area 30, that is error free. The eye is surrounded by a second area 31 with single errors; around the second area 31 there is an area 32 with many errors. The area at the outside contains just errors.

With this eye diagram, a user may detect under which conditions the receive unit safely still works. The eye diagram may further be taken at different temperatures, with which a more complete picture of the quality of the receive unit may be gotten.

It may be surprising that there are errors not only at voltages being too low but also at voltages that are too high. This is due to the fact that the supply voltage is also used as reference voltage in the receive unit.

In the shown eye diagram of FIG. 3, errors that occur in the receive unit 10 but are repaired by the filter 11 or the processor 12, are not shown. This is appropriate, because these errors would be repaired in the normal mode of the integrated circuit 1. Thus, the user sees just errors that would cause problems also in the normal mode.

What is claimed is:

1. An integrated circuit, comprising:
   a receive unit to be tested for receiving an input signal and storing the input signal at a predetermined point in time;
   a filter for providing a filtered input signal based on the input signal;
   a processor configured to:
      provide an error-corrected signal based on the stored input signal,
      compare the error-corrected signal with an expectation value, and
      output a failure message when the filtered input signal does not correspond to the expectation value;
   a power supply for supplying the receive unit to be tested with an adjustable voltage or an adjustable current, and
   an adjustment unit for varying the predetermined point in time and the adjustable voltage or the adjustable current, respectively.

2. The integrated circuit according to claim 1, whereby the expectation value is provided by a signal stored in the integrated circuit.

3. The integrated circuit according to claim 1, further comprising:
   a further receive unit disposed on the integrated circuit, whereby the expectation value is provided by a signal that is received by the further receive unit.

4. The integrated circuit according to claim 1, wherein the processor is configured to perform error correction of the filtered input signal to thereby provide the error-corrected signal.

5. The integrated circuit according to claim 4, whereby the processor is configured to perform the error correction according to values of the input signal being received in parallel.

6. The integrated circuit according to claim 4, whereby the processor is configured to perform the error correction according to values of the input signal being received serially.

7. A method for testing an integrated circuit, whereby the method comprises:
   receiving an input signal at a receive unit to be tested, and storing the input signal at a predetermined point in time;
   providing a filtered input signal based on the input signal;
   applying an error correction to the input signal, thereby generating an error corrected signal;
   comparing the error corrected signal with an expectation value;
   outputting an error message when the filtered input signal does not correspond to the expectation value;
   supplying the receive unit to be tested with an adjustable voltage or an adjustable current; and
   varying the predetermined point in time and the adjustable voltage or the adjustable current.

8. The method according to claim 7, whereby the expectation value is provided by a stored signal.

9. The method according to claim 7, whereby the expectation value is provided by a signal that is received by a further receive unit.

10. The method according to claim 7, further comprising a filter for filtering the stored input signal, whereby the filtered input signal undergoes an error correction.

11. The method according to claim 7, whereby the error correction is performed according to values of the input signal being received in parallel.

12. The method according to claim 7, whereby the error correction is performed according to values of the input signal being subsequently received.

13. An integrated circuit, comprising:
   a receive unit including an input terminal, an output terminal, and a control terminal, the input terminal configured to receive an input signal;
   a filter including an filter input and a filter output, the filter input coupled to the output terminal of the receive unit, and the filter output configured to provide a filtered input signal that is based on the input signal;
   a processor having a processor input coupled to filter output and configured to provide an adjustment value and a failure message that are based on the filtered input signal and an expectation value;
   a communication path coupling an output of the processor back to the control terminal of the receive unit;
   a power supply configured to provide an adjustable voltage or an adjustable current to a location on the communication path; and
   an adjustment unit disposed at the location on the communication path and coupled to the power supply, the adjustment unit configured to vary the adjustable voltage or the adjustable current, respectively, based on the adjustment value.

14. The integrated circuit according to claim 13, wherein the receive unit to be tested is configured to store the input signal at a predetermined point in time; and wherein the adjustment unit is configured to adjust the predetermined point in time based on the adjustment value.

15. The integrated circuit according to claim 14, wherein the adjustment unit comprises a phase adjustment unit configured to adjust the predetermined point in time and a voltage adjustment unit to adjust the adjustable voltage or the adjustable current.

16. The integrated circuit according to claim 15, wherein the phase adjustment unit is a phase locked loop and the voltage adjustment unit is a low-drop-out voltage controller.

17. The integrated circuit of claim 13, further comprising:
a further receive unit having a further input terminal, a further output terminal, and a further control terminal;
wherein the further input terminal of the further receive unit is coupled to the input terminal of the receive unit, and the further output terminal is coupled to the processor, and
wherein the expectation value is generated by the further receive unit based on the input signal.

18. The integrated circuit according to claim 13, further comprising:
memory included in the integrated circuit and coupled to the processor, the memory configured to store the expectation value.

19. The integrated circuit according to claim 13, whereby the processor is configured to perform error correction according to values of the input signal being received in parallel.

20. The integrated circuit according to claim 13, whereby the processor is configured to perform error correction according to values of the input signal being received serially.

* * * * *